United States Patent [19]

Hapke

[11] 4,339,710
[45] Jul. 13, 1982

[54] MOS INTEGRATED TEST CIRCUIT USING FIELD EFFECT TRANSISTORS

[75] Inventor: Friedrich Hapke, Hamburg, Fed. Rep. of Germany

[73] Assignee: U.S. Philips Corporation, New York, N.Y.

[21] Appl. No.: 117,885

[22] Filed: Feb. 1, 1980

[30] Foreign Application Priority Data

Feb. 12, 1979 [DE] Fed. Rep. of Germany ....... 2905271

[51] Int. Cl.³ ............................................. G01R 15/12
[52] U.S. Cl. .................................... 324/73 R; 307/581
[58] Field of Search ............ 324/73 R, 73 PC, 158 T, 324/158 R, 158 D; 307/581

[56] References Cited

U.S. PATENT DOCUMENTS 3,509,375  4/1970  Gormley .............................. 307/581
4,053,833 10/1977  Malmberg et al. .............. 324/158 R

OTHER PUBLICATIONS

Abilevitz et al., "Circuit for Facilitating the Testing of Semiconductor Chips on a Module", IBM Tech Disc. Bull., vol. 22, No. 2, 8/1979, pp. 1018-1021.

Primary Examiner—Gerard R. Strecker
Assistant Examiner—Walter E. Snow
Attorney, Agent, or Firm—Thomas A. Briody; Robert T. Mayer; Steven R. Biren

[57] ABSTRACT

An MOS integrated circuit arrangement with field-effect transistors includes a circuit arrangement for rapidly testing various blocks of the circuit. This circuit arrangement includes three transistor-switch groups; a first group for testing an input block, a second group for connecting and disconnecting the input block and an output block so that the blocks may be tested in combination, and a third group for testing the output block. The disclosed circuit provides a single and yet effective testing arrangement.

1 Claim, 3 Drawing Figures

MOS INTEGRATED TEST CIRCUIT USING FIELD EFFECT TRANSISTORS

BACKGROUND OF THE INVENTION

The invention relates to an integrated circuit arrangement in MOS technology with field effect transistors, in which the individual circuit sections, i.e. the blocks, of the integrated circuit arrangement are interconnected by field-effect transistor switches which can be switched by external test signals applied for testing, and each field-effect transistor is connected to ground or to a negative voltage with its substrate connection.

Such circuit arrangements are known per se. The higher the degree of integration, the more important it becomes to test the individual circuit sections during manufacture and for this purpose it has already been proposed in the literature to divide very complex integrated circuits into separate so-called blocks and to provide these blocks with arrangements by means of which the individual blocks can be isolated from each other so as to enable them to be tested individually and independently of each other. Normally, such isolation is achieved by a switch and in circuit arrangements of this type in MOS technology with field-effect transistors this switch may be a field-effect transistor which is arranged accordingly. Literature relating to the theory of this subject may be found in two papers by Ramamoorthy, a paper in "Journal of the Association for Computing Machinery", Vol. 13, no. 2, April 1966, pages 211 to 222 entitled "Analysis of Graphs by Connectivity Considerations" and another article by the same author in "AFIPS Conference Proceedings", 1967, Spring Joint Computer Conference 30, pages 743 to 756, entitled "A structural theory of machine diagnosis". In particular, in the last-mentioned reference, an arrangement is shown in FIGS. 2a and 2b on page 746 and in the right-hand column of the associated description it is demonstrated that a subsystem, i.e. one block, is to be isolated from its adjacent block, and that this is possible only by means of a switch. Further literature on this subject, relating to field-effect transistors in general, can be found in the book by Tietze and Schenk "Halbleiter-Schaltungstechnik", 4th edition 1978, for example pp. 77 et seq.

This is the state of the art on which the invention is based. From the foregoing references it is in principle known how field-effect transistors are to be arranged. Furthermore, it is known from the general literature how an integration in MOS technology is to be realized and thus, in particular, how such test points should be included in circuit arrangements, as is revealed by the two aforementioned references. The invention describes a method which by means of a simple arrangement enables an arbitrary number of so-called input blocks and an arbitrary number of so-called output blocks to be tested individually or in combination, a first test generally not being completely unambiguous and a second test being necessary, which is independent of the first test, but which immediately yields as result whether a fault occurs in a so-called input block or in a so-called output block.

In order to solve such a problem in the case of an integrated circuit arrangement in MOS-technology with field-effect transistors of the type mentioned above, for testing at least two blocks, namely one input block and one output block, independently of each other, according to the invention at least three field-effect transistor-switch groups are connected to a common connection point, which is connected to the supply voltage via a first field-effect transistor of the depletion type, connected as a load resistor, the field-effect transistor-switch groups each comprising two series-connected enhancement-type field-effect transistors.

In a first switch group for testing an input block a second field-effect transistor is connected with its gate connection to the common connection point, with its drain connection both to a first external connection point and via a third field-effect transistor of the depletion type, arranged as a load resistor, to the supply voltage, and with its source connection to the drain connection of a fourth field-effect transistor, whose source connection is connected to ground and whose gate connection is connected to a first control line.

In a second switching group for connecting or disconnecting an input block a fifth field-effect transistor is connected with its drain connection to the common connection point, with its gate connection to the output of the input block, and with its source connection to the drain connection of a sixth field-effect transistor, whose source connection is connected to ground and whose gate connection is connected to a second control line.

In a third group, for testing an output block, the drain connection of a seventh field-effect transistor is connected to the common connection point, its gate is connected to a second external connection point, and its source is connected to the drain connection of an eighth field-effect transistor, whose source connection is connected to ground and whose gate connection is connected to a third control line.

Thus, when the invention is used, the first group is always necessary. The second group is required for connecting or disconnecting an input block. Therefore, it is included as many times as there are input blocks, and the third group, for testing the output block, is included once if only one output block is to be tested. However, if a plurality of output blocks are to be tested, it should be provided as many times as there are output blocks.

The invention offers a very simple circuit arrangement, which can be integrated into the integrated circuit arrangement and which operates via test connections, which test connections may also be so-called internal connections.

BRIEF DESCRIPTION OF THE DRAWING

An embodiment of the invention is shown in the drawing and is described in more detail hereinafter. In the drawing.

DETAILED DESCRIPTION

Figure 1:
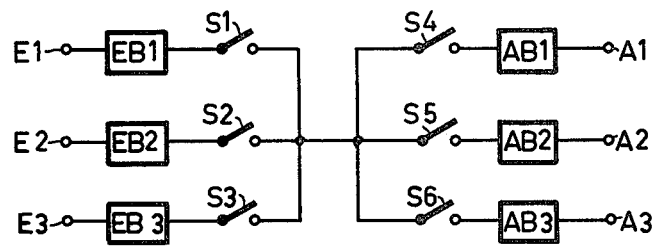
FIG. 1 represents the interconnection or disconnection of individual input blocks and individual output blocks.

In FIG. 1 the external connections of an IC, i.e. an integrated circuit arrangement, are designated E1, E2, E3 as well as A1, A2 and A3. The internal circuitry of the IC, i.e. the so-called integrated circuit arrangement, is divided into individual circuits, i.e. so-called blocks, and in the direction of the signal flow, for example viewed from connection point E1, there is first provided the input block EB1, which can be connected to the output blocks AB1, AB2 or AB3. In a similar way the input signal can enter the circuit from connection point E2, namely via the input block EB2, and can be connected to one of the three output blocks. The same applies to the connection point E3 with the input block EB3. In order to obtain several disconnection possibilities, there have been provided the switches S1, S2, S3, S4, S5 and S6.

Figure 2:
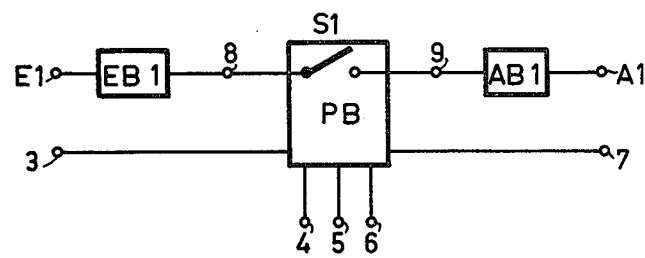
FIG. 2 is a selected circuit arrangement with an input block and an output block and one test block.

FIG. 2 shows an embodiment of the invention. In this case there is provided an input terminal E1. It is followed by an input circuit EB1. This circuit has an output 8 and this output now leads via the switch S1 to the input 9 of the output block AB1 and hence to output A1. The switch S1 disconnects the input block EB1 from the output block AB1 for the purpose of testing. For this test there is provided a so-called test block, and this test block also has special connections in addition to the connections for the switch S1, i.e. in addition to the connections 8 and 9, namely the connections 3 and 7, which may be external or internal connections, and the connections 4, 5 and 6, which are generally control connections and which may also be internal or external connections.

Figure 3:
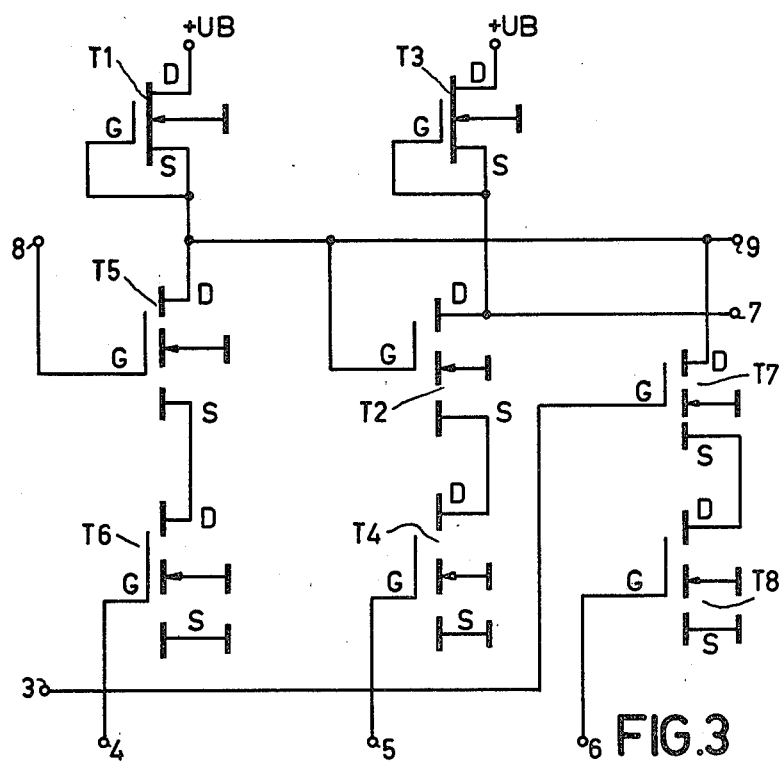
FIG. 3 is an example of a test block.

FIG. 3 shows an example of such a test block. The two connections for the switch S1, namely the connections 8, i.e. the output of the input block EB1 and the common connection line 9, which also constitutes the input for the output block AB1, can be found in FIG. 3. Normally, i.e. not in the case of testing, the input block EB1 is connected to the output block AB1. The field-effect transistor T6, which for the sake of brevity is hereinafter referred to as transistor instead of field-effect transistor, is continuously held conductive and the signals applied from the output of EB1 to point 8 switch the transistor T5, i.e. they turn transistor T5 on or off, and because T1 is connected as a load resistor, point 9 can now assume the digital states LO and HI. T6 is turned on via control line 4.

Furthermore, the control inputs 5 and 6 should be kept at approximately 0 V, in order to ensure that transistors T4 and T8 remain cut off. Now assume that a test is conducted. The signal on the control line 4 remains for testing. The signal on the control line 5, however, is now raised from zero to for example +5 V, if the battery voltage +UB is +5 V. As a result of this, transistor T4 is turned on. A test signal can now be applied to the common connection line 9 from E1 via EB1, via point 8 and via T5. However, via AB1 it also appears on A1, if this section is in order, but, and this is more important, via transistor T2 it is now applied to the external connection point 7 so that it can now be ascertained whether the signal obtained from EB1 is correct, i.e. whether a fault occurs between E1 and point 8 in the circuit of FIG. 2. However, it may be possible that a fault occurs in the input circuit of the output block AB1. In that case the signal on point 7 would be ambiguous, because it cannot be ascertained precisely whether a fault occurs in the circuit EB1, i.e. in the input block EB1, or in the input circuit to output block AB1. Therefore, the block AB1 should also be tested individually. For this purpose the control line 4 is connected to ground. A signal from E1 can then no longer reach point 8 and thus cannot be transmitted to point 9, because transistor T6 is cut off.

The control line, point 5 is now also connected to ground, so that the transistor T4 is cut off and thus output 7 is blocked. The control line to point 6 is now connected to, for example, a potential of +5 V, so that transistor T8 is turned on. It is now possible to apply a test signal from the external connection 3 via transistor T7 to the common connection line 9, and via output block AB1 to output A1, thus enabling the block AB1 to be tested independently of block EB1.

It follows from the description that a test is now possible. This test is effected digitally, i.e. the signals always have either a high value or a low value, and for this purpose the transistors T1 and T3 are provided, which ensure that the connection point 9 or the output 7 is at a specific potential, which can be raised or reduced, because transistor T3, like transistor T1, is connected as a load resistor, so that in a very simple manner the individual circuit blocks can be tested. A circuit similar to that of T2 and T4 is always required. For an input block a circuit, i.e. a field-effect transistor switch group T5, T6, is required. If two input blocks should be connected, a switch group T5' and T6', not shown, should be included, and if a further output block AB2 is connected and is to be tested, a further switch group T7', T8' is included, which is connected in parallel with the transistors T7, T8 and which in a similar manner to the switch group T5' and T6' requires an additional control connection, while the switch group for the output block should also have a connection to the gate of the transistor T7', namely the connection 3 or another external connection, and the other switch group a connection to the gate of the transistor T5, i.e. the output for the additional input block.

A stated previously, the control lines 4, 5 and 6 need not be led out, but may also be constituted by internal connections.

What is claimed is:

1. An MOS integrated circuit arrangement with field-effect transistors, in which the individual circuit block sections of the integrated circuit arrangement are interconnected by field-effect transistor switches which are switchable by external test signals, and in which each field-effect transistor is connected to a voltage no higher than ground through its substrate connection, characterized in that for testing at least two circuit blocks, an input block (EB1) and an output block (AB1), individually and in combination, at least three parallel field-effect transistor-switch groups are provided, each connecting to a common connection point (9) which is connected to the supply voltage (+UB) by a first field-effect transistor (T1) of the depletion type connected as a load resistor, the field-effect transistor-switch groups each comprising two series-connected field-effect transistors of the enhancement type, said switch groups further comprising:

a first group for testing the input block (EB1) and having a second field-effect transistor (T2) connected with its gate connection to the common connection point (9), with its drain connection both to a first external connection point (7) and by a third field-effect transistor (T3) of the depletion type, connected as a load resistor, to the supply voltage (+UB), and with its source connection to the drain connection of a fourth field-effect transistor (T4) whose source connection is connected to ground and whose gate connection is connected to a first control line (5);

a second group for connecting and disconnecting the input block (EB1) and the output block (AB1) and having a fifth field-effect transistor (T5) connected with its drain connection to the common connection point (9), with its gate connection to the output (8) of the input block (EB1), and with its source connection to the drain connection of a sixth field-effect transistor (T6) whose source connection is connected to ground and whose gate connection is connected to a second control line (4);

a third group for testing the output block (AB1), in which the drain connection of a seventh field-effect transistor (T7) is connected to the common connection point (9), its gate connection is connected to a second external connection point (3), and its source connection is connected to the drain connection of an eighth field-effect transistor (T8) whose source connection is connected to ground and whose gate connection is connected to a third control line (6).

* * * * *